DIRECT COUPLED TWO TRANSISTORS CRYSTAL OSCILLATOR

Filed Aug. 8, 1968

INVENTOR
YASUTOMO MIYAKE AND
TOSHIO SHINADA

BY Linton and Linton
ATTORNEYS 3,539,944

DIRECT COUPLED TWO TRANSISTORS CRYSTAL OSCILLATOR

Yasutomo Miyake, Yokohama, and Toshio Shinada, Tokyo, Japan, assignors to Kabushiki-Kaisha Kinseki-sha-Kenkyujo, Tokyo, Japan, a corporation of Japan Filed Aug. 8, 1968, Ser. No. 751,245
Claims priority, application Japan, Aug. 15, 1967, 42/52,545
Int. Cl. H03b 5/36
U.S. Cl. 331—116 1 Claim

ABSTRACT OF THE DISCLOSURE

The present transistorized crystal oscillator has a pair of transistors coupled directly together for providing relatively small-sized high frequency oscillators having simplified integral circuits.

The present invention relates to an improvement in transistorized crystal oscillators having two transistors, one of which transistors is coupled directly to another transistor.

It is an object of the present invention to provide small-sized high frequency oscillators which may effect stable oscillation.

It is another object of the present invention to provide transistorized crystal oscillators having two transistors directly coupled together which oscillators may effect oscillation with overtones.

It is still another object of the present invention to provide means for simplifying circuits of transistorized crystal oscillators having two directly coupled transistors.

It is accordingly still another object of the present invention to provide means for reducing high frequency oscillators into integral circuits easily.

The features and advantages of the present invention will become apparent by reference to the following description taken in connection with the accompanying drawings in which.

Figure 4:
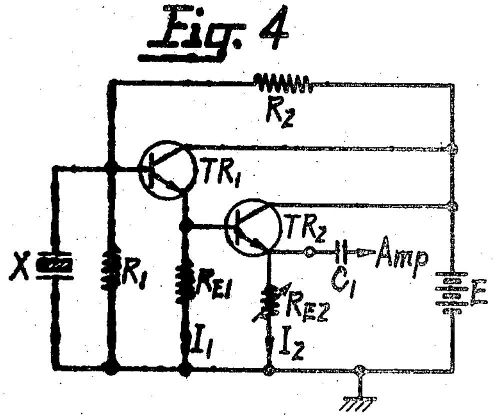
FIG. 4 is a circuit diagram of an embodiment according to the present invention.
Figure 5:
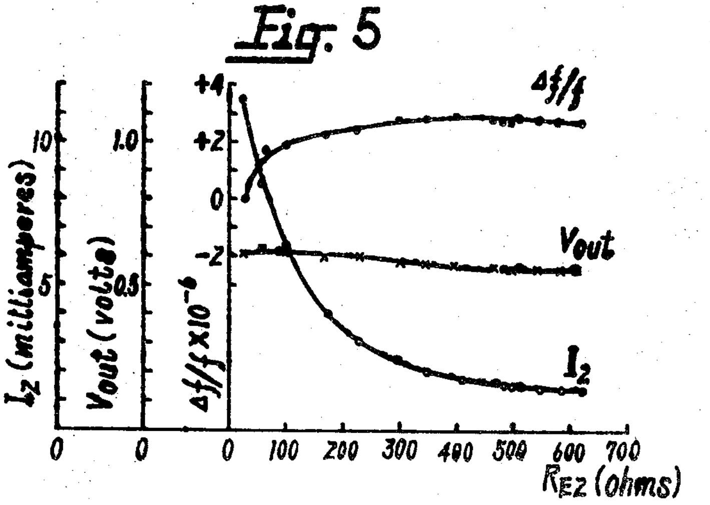

And, FIG. 5 shows for the oscillator of FIG. 4 the characteristic curves of the second transistor emitter current $I_2$, the output voltage $V_{out}$, and the frequency deviation $\Delta f/f$ respectively against the resistance $R_{E2}$ connected to the second transistor emitter, which curves were obtained experimentally.

A transistorized crystal oscillator according to the present invention comprises a transistor, a second transistor, an oscillation element connected between the base of the first transistor and the ground, the emitter of said first transistor being connected to the base of said second transistor, the collectors of said first and second transistors being grounded with respect to high frequency current, and a resistor being connected between the emitter of said first transistor and the ground whereby, the input capacitance of said second transistor is the emitter capacitance of said first transistor so that the circuit of said first transistor forms an emitter follower.

Figure 1:
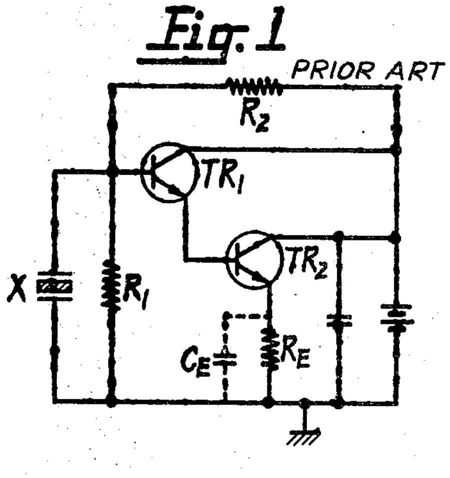
FIG. 1 is a circuit diagram of a known transistorized crystal oscillator having two directly coupled transistors.

In FIG. 1, a circuit of an oscillator which is known as a direct coupled two transistors crystal oscillator is shown. In this circuit, transistors $TR_1$ and $TR_2$ are connected in Darlington connection, and a resistor $R_E$ or a parallel circuit of a resistor $R_E$ and a condenser $C_E$ is connected between the emitter of the second transistor $TR_2$ and the ground.

This known oscillator circuit has defects as follows: (1) while there is no difficulty in designing an oscillator for effecting oscillation with fundamental frequency of the piezoelectric crystal unit, it is extremely difficult for effecting oscillation with overtones of said crystal unit. (2) The emitter current of first transistor $TR_1$ is too small to operate said transistor at a normal condition, because said first transistor $TR_1$ is connected directly to second transistor $TR_2$. (3) It is difficult to effect oscillation except when resistances $R_1$ and $R_2$ for supplying direct current have such high values as about a megohm. This causes difficulties in reducing an oscillator into a small size one such as an integral circuit.

Figure 2:
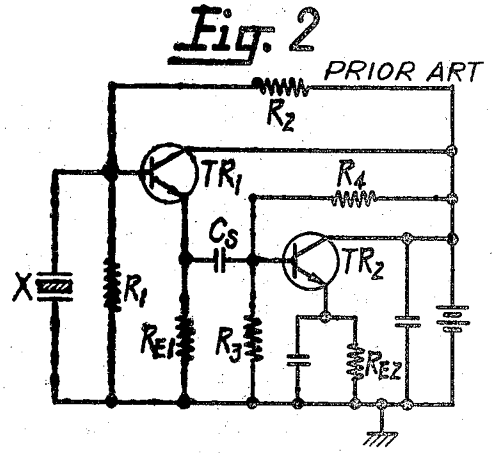
FIG. 2 is a circuit diagram of another known transistorized crystal oscillator having two transistors, but one transistor is not coupled directly to the other transistor.

As to the above-noted second defect, that is the emitter current of first transistor $TR_1$ is small, there is known means for eliminating such a defect as follows: As shown in FIG. 2, the emitter of transistor $TR_1$ is grounded through a resistor $R_{E1}$ having an appropriate resistance value, and the relation between the emitter of transistor $TR_1$ and the base of transistor $TR_2$ is cut off with respect to direct current with a condenser $C_s$. However, according to such means, the transistors $TR_1$ and $TR_2$ require each its own resistor for supplying direct current thereto, and such a requirement necessarily makes the oscillator circuit complicated.

Figure 3:
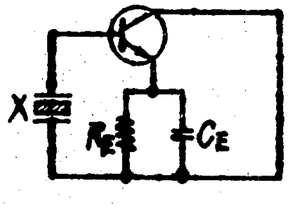
FIG. 3 is a circuit diagram showing the fundamental diagram of an emitter follower type transistorized crystal oscillator.

Now, referring to FIG. 4 in which is shown an embodiment of the present invention. This oscillator circuit includes a transistor $TR_2$ and a resistor $R_{E2}$ connected between the emitter of the same transistor and the ground. And, it will be seen easily that the input capacitance of the circuit of transistor $TR_2$ is connected in parallel with resistor $R_{E1}$. This resistor $R_{E1}$ is connected between the emitter of transistor $TR_1$ and the ground. So, it will be seen that the circuit of transistor $TR_1$ is provided with a composition equivalent to that shown in FIG. 3. Thus, the circuit of transistor $TR_1$ may oscillate as an emitter follower. According to the present invention, no direct current blocking condenser, such as shown at $C_s$ in an oscillator circuit of FIG. 2 is required. Thus, only two resistors $R_1$ and $R_2$ are required for resistors. Furthermore, by changing the value of resistor $R_{E1}$ which is connected to the emitter of transistor $TR_1$ the current in the same transistor $TR_1$ can be changed at will. In consequence, oscillation wave form and value of output of the oscillator can be controlled, and resistance values of the resistors can be small. Also, oscillation with overtones which is extremely difficult with a known oscillator circuit as shown in FIG. 1 can be effected easily by adjusting resistance values of the resistors $R_{E1}$ and $R_{E2}$.

In FIG. 5, results of an experiment by using an oscillator having a circuit of FIG. 4 is shown. In this experiment, types of transistors and numerical values of constants are as follows:

$TR_1$:2SC266
$TR_2$:2SC182
$f$:20.960660 mHz.
$R_1=R_2$:200 kilohms
$R_{E1}$:1 kilohm
E:6 volts
$I_1$:1.25 milliamperes Quartz vibrator X has a fundamental vibration frequency 7 mHz. and was oscillated with the third overtone. In FIG. 5, values of output $V_{out}$ is graduated with the product of output of the oscillator and the gain of the amplifier for measurement.

It will be understood from the foregoing description that according to the present invention, an oscillator is possible to be reduced into an integral circuit by using the current technological art, because an oscillator according to the present invention which has two directly coupled transistors requires no direct current blocking condenser for coupling said transistors and no emitter condensers. And, it will further be understood that the present invention is markedly more advantageous than a transistorized oscillator circuit in a Darlington connection, because in the present circuit, the emitter current of first transistor $TR_1$ can be selected at will by changing value of resistor $R_{E1}$ connected between said transistor emitter and the ground so as to oscillate with overtones, and also, resistance values of resistors $R_1$ and $R_2$ are considerably small as compared with those in a Darlington connection. In addition to these advantages, an oscillator according to the present invention can be stabilized in oscillation frequency easily by using heat-sensitive resistors such as thermistors or posistors for the resistors $R_{E1}$ and $R_{E2}$ so as to effect compensation in values of resistances to temperatures. For the oscillation elements in the oscillator circuit, a piezoelectric element such as quartz vibrators or barium titanate ceramics, a resonance circuit, an inductance coil or other resonators may be used.

Having thus described our invention what is claimed for Letters Patent is:

1. A transistorized crystal oscillator comprising a transistor, a second transistor, a piezoelectric crystal unit connected between the first transistor base and the ground, the emitter of said first transistor being connected directly to the base of said second transistor and connected through a resistor to the ground, the collectors of said first and second transistors being grounded with respect to high frequency current, and the second transistor emitter being connected to an output terminal of the oscillator and connected through a resistor to the ground whereby, the second transistor input circuit is connected in parallel to said resistor connected to the first transistor emitter so that the first transistor circuit forms an emitter follower having for the emitter capacitance the second transistor input capacitance.

References Cited

UNITED STATES PATENTS

| | | | |
|---|---|---|---|
| 2,980,865 | 4/1961 | Hilbourne | 331—116 |
| 3,204,196 | 8/1965 | Polizzi | 331—116 X |
| 3,263,184 | 7/1966 | French et al. | 331—117 X |
| 3,374,445 | 3/1968 | Gaunt | 331—117 X |

ROY LAKE, Primary Examiner

S. H. GRIMM, Assistant Examiner

U.S. Cl. X.R.

331—159